United States Patent
Arsovski et al.

(10) Patent No.: US 8,233,337 B2
(45) Date of Patent: Jul. 31, 2012

(54) SRAM DELAY CIRCUIT THAT TRACKS BITCELL CHARACTERISTICS

(75) Inventors: Igor Arsovski, Williston, VT (US); George Maria Braceras, Essex Junction, VT (US); Robert M. Houle, Williston, VT (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 303 days.

(21) Appl. No.: 12/581,440

(22) Filed: Oct. 19, 2009

(65) Prior Publication Data
US 2011/0090750 A1    Apr. 21, 2011

(51) Int. Cl.
G11C 7/00 (2006.01)
G11C 7/02 (2006.01)
G11C 11/00 (2006.01)

(52) U.S. Cl. ........... 365/194; 365/210.1; 365/154
(58) Field of Classification Search ............ None
See application file for complete search history.

(56) References Cited

U.S. PATENT DOCUMENTS

| | | | |
|---|---|---|---|
| 5,999,482 A | 12/1999 | Kornachuk et al. | |
| 6,072,733 A | 6/2000 | Advani et al. | |
| 6,473,356 B1 | 10/2002 | Raszka et al. | |
| 6,717,877 B2 | 4/2004 | Suzuki et al. | |
| 6,738,296 B2 | 5/2004 | Sung et al. | |
| 6,977,834 B2 | 12/2005 | Onizawa et al. | |
| 7,142,466 B1 | 11/2006 | Muthalif et al. | |
| 7,440,312 B2 | 10/2008 | Hollis et al. | |
| 2003/0206448 A1* | 11/2003 | Sung et al. | 365/189.07 |
| 2006/0114733 A1* | 6/2006 | Hosono | 365/206 |

OTHER PUBLICATIONS

Zambuto, "PCT International Search Report and Written Opinion", PCT/US2010/048052, Sep. 8, 2010, 14 pages.

* cited by examiner

Primary Examiner — Hoai V Ho
Assistant Examiner — James G Norman
(74) Attorney, Agent, or Firm — Hoffman Warnick LLC; David A. Cain

(57) ABSTRACT

An SRAM delay circuit that tracks bitcell characteristics. A circuit is disclosed that includes an input node for receiving an input signal; a reference node for capturing a reference current from a plurality of reference cells; a capacitance network having a discharge that is controlled by the reference current; and an output circuit that outputs the input signal with a delay, wherein the delay is controlled by the discharge of the capacitance network.

25 Claims, 8 Drawing Sheets

SRAM DELAY CIRCUIT THAT TRACKS BITCELL CHARACTERISTICS

FIELD OF THE INVENTION

This disclosure is related to SRAM devices, and more particularly to an SRAM circuit for generating a delay that tracks bitcell characteristics and is independent of any non-cell devices.

BACKGROUND OF THE INVENTION

SRAM (static random access memory) devices are commonly utilized for static memory storage. Each bit is typically stored in an SRAM storage cell with four transistors. Two additional access transistors serve to control access to a storage cell during read and write operations. Access to the cell is enabled by a word line that controls the two access transistors which, in turn, control whether the cell should be connected to the bit lines, which are used to transfer data for both read and write operations.

One of the challenges that must be dealt with in implementing an SRAM is accounting for the delay that occurs between: (1) the time the word line is turned on; and (2) the time the data is ready to be read off of the bit lines with a sensing amplifier. Because the delay can be relatively variable based on any number of factors, some type of circuit for generating a delay is required to notify the sensing amplifier when to fire and read the bit lines. Current approaches utilize logic devices to generate the delay. Unfortunately, logic devices are subject to process, voltage and temperature (PVT) variations that differ from the SRAM cell devices. Using logic devices results in less than optimal performance and increased susceptibility to SRAM cell writability and stability problems.

SUMMARY OF THE INVENTION

Disclosed is an SRAM circuit for generating a delay that tracks bitcell characteristics and is independent of any logic devices. In a first aspect, the invention provides an SRAM device having a delay circuit for tracking SRAM bitcell characteristics, wherein the delay circuit comprises: an input node for receiving an input signal; a reference node for capturing a reference current from a plurality of reference SRAM cells; a capacitance network having a discharge rate that is controlled by the reference current; and an output circuit that outputs a delay signal, wherein the delay signal is controlled by the discharge rate of the capacitance network.

In a second aspect, the invention provides a method of generating a delay signal in an SRAM device, comprising: providing an SRAM device with a plurality of reference cells coupled to a common reference node, wherein the plurality of reference cells are configured to generate a reference current at the common reference node in response to a word line transition; generating the reference current at the common reference node in response to the word line transition; using the reference current to dictate a discharge rate of a capacitance network onto a discharge line; activating an output circuit in response to the voltage potential on the discharge line exceeding a threshold voltage; and outputting a delay signal.

In a third aspect, the invention provides a system for generating a delay signal in an SRAM device, comprising: a plurality of reference cells coupled to a common reference node, wherein the plurality of reference cells are configured to generate a reference current at the common reference node in response to a word line transition and wherein the reference current comprises a mean characteristic of the plurality of reference cells; a circuit that dictates a discharge rate of a capacitance network onto a discharge line using the reference current; an output circuit that is activated in response to a voltage potential on the discharge line exceeding a threshold voltage; and an output node that outputs a delay signal in response to the pass gate transistor being activated.

In a fourth aspect, the invention provides an SRAM device having a delay circuit that utilizes a virtual ground for tracking SRAM bitcell characteristics, wherein the delay circuit comprises: an input node for receiving an input signal; a virtual ground node for capturing a reference current from a plurality of reference SRAM cells; a capacitance network having a pair of capacitors that provide a discharge rate controlled by the reference current; and an output circuit that outputs a delay signal, wherein the delay signal is controlled by the discharge rate of the capacitance network.

The illustrative aspects of the present invention are designed to solve the problems herein described and other problems not discussed.

BRIEF DESCRIPTION OF THE DRAWINGS

These and other features of this invention will be more readily understood from the following detailed description of the various aspects of the invention taken in conjunction with the accompanying drawings.

Figure 1:
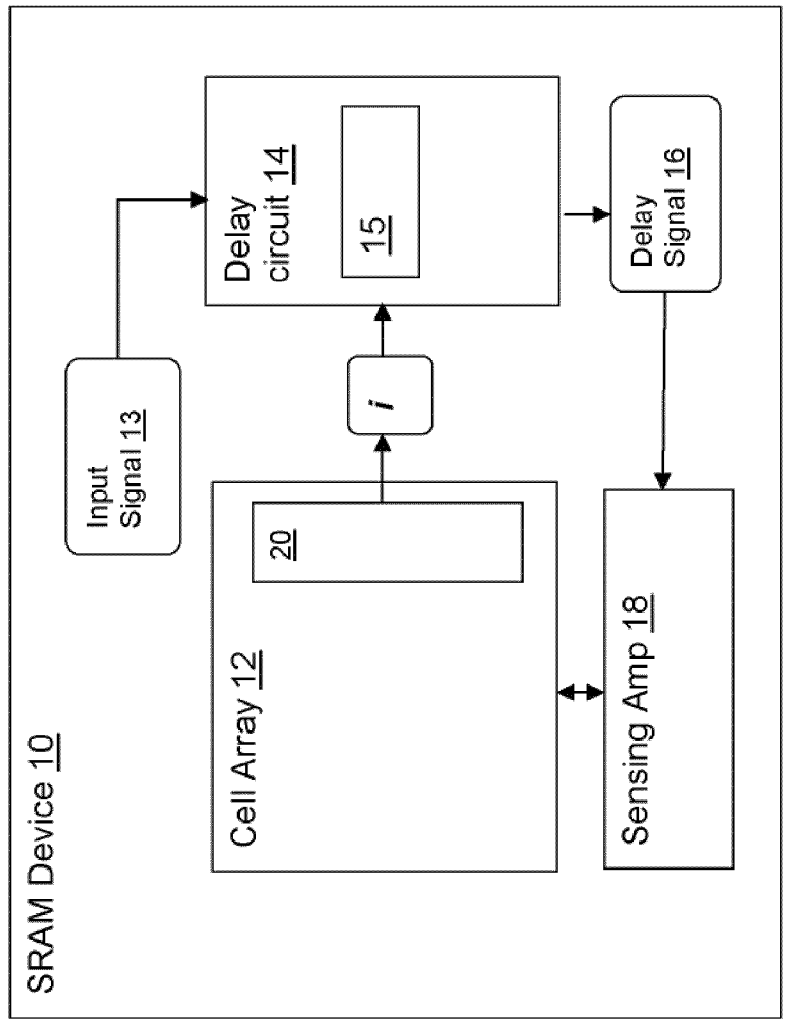
FIG. 1 depicts an SRAM device having a delay circuit in accordance with an embodiment of the present invention.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

FIG. 1 depicts an SRAM device 10 that includes a delay circuit 14 for generating a delay signal 16, which is a delayed version of an input signal 13. Input signal 13 may for example comprise a clock transition that activates the reading and/or writing operations on the SRAM device 10. The amount of delay in the delay signal 16 is based on a reference current i obtained from a set of reference cells 20 (i.e., bitcells) in a cell array 12. Note that reference cells 20 need not be in the functional cell array 12 but could reside elsewhere, such as a small separate reference array. The delay circuit 14 utilizes a capacitance network 15 having one or more capacitors to generate a discharge based on the reference current i. The discharge controls the amount of delay in the delay signal 16.

In this embodiment, the delay signal 16 is provided to a sensing amp 18 to determine when bit lines in the cell array 12 should be read from/written to. It is understood however that the delay signal 16 could be used for any purpose, such as to define the WL (word line) pulse width, BL (bit line) restore activation, etc. This approach thus extracts SRAM device characteristics to control timing without modifying the fabrication layout of the device itself, since the reference cells 20 could simply be implemented as an extra set of bitcells in the cell array 12 or as a separate distinct array. The set of reference cells 20 may, e.g., comprise 16 or 32 cells from which an average or reference current i is obtained, thereby statistically eliminating performance variations among the cells. Various embodiments for obtaining the reference current i, as well as various delay circuits 14, are described.

Figure 2:
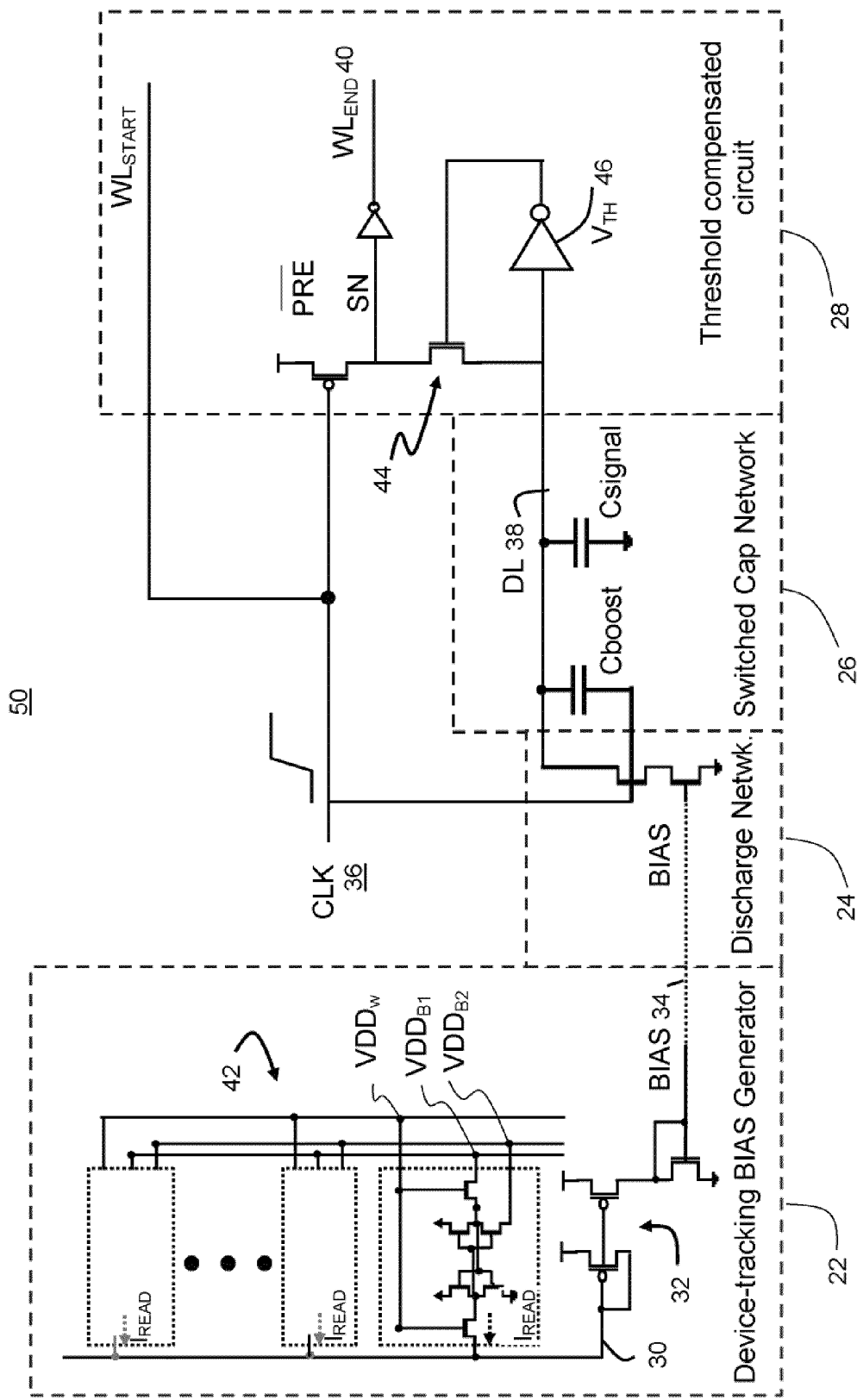
FIG. 2 depicts a delay circuit in accordance with an embodiment of the present invention.

FIG. 2 depicts an illustrative embodiment of a delay circuit 50 that includes four components, including a device-tracking bias generator 22, a discharge network 24, a switched capacitance network 26 and a threshold-compensated circuit 28. The delay circuit 50 obtains reference current 30 from a set of reference cells 42 and generates a delayed waveform 40 ($WL_{END}$), which is a delayed version of the word line or clock signal 36 (CLK, $WL_{START}$). The delayed waveform 40 essentially mimics the word line $WL_{START}$ behavior in the device, except with a delay. In reference cells 42, the word line $VDD_W$ and bit lines $VDD_{B1}$ and $VDD_{B2}$ are all set to VDD, and the currents are obtained from $I_{READ}$ nodes on each cell. To avoid impacting the reference cell SRAM characteristics, the signals in the reference cells 42 can be set using existing cell signals common to both reference and functional SRAM cells without additional metal lines or vias. This allows SRAM device characteristics to be extracted without modifying the fabrication layout of the reference SRAM cells.

The device-tracking bias generator 22 includes a current mirror 32 that receives the reference current 30 from the reference cells 42 and generates a bias 34. The bias 34 is then fed into a discharge network 24, which discharges the signal onto a discharge line (DL) node 38 in a switched capacitance network 26 when the clock signal 36 rises. The bias 34 determines the rate of discharge for the DL node 38 through the discharge network 24.

When the CLK 36 is low, the threshold compensated circuit 28 works by charging up the DL node 38 to the threshold of inverter 46 and self calibrating to cancel any threshold variation introduced by PVT and device mismatch. When the CLK 36 is high, the charge-up of the DL node 38 stops, and the threshold compensated circuit 28 generates a rising edge when the DL voltage discharges across the threshold of inverter 46.

When the CLK 36 transitions high the switched capacitance network 26 generates a logic-device independent voltage delta on the DL node 38 based on the DL precharge-voltage that was generated when the CLK 36 is low, and the ratio of Cboost-to-Csignal. In effect, the switched capacitance network boosts the voltage on the DL line from the threshold voltage of inverter 46 to a voltage higher than the threshold of inverter 46 by the ratio between Cboost and Csignal.

The voltage delta on the DL node 38 then discharges through the discharge network 24 and opens a threshold gate 44 when the voltage delta gets high enough to overcome the voltage threshold of inverter 46. Threshold gate 44 and inverter 46 ensure a virtually PVT-independent delay signal 40 ($WL_{END}$) with low sensitivity to random device variation (i.e., self-calibration as described above). Thus, the delay is mostly a function of the DL voltage that was generated by the boost, the capacitance on the DL node 38, and the reference current that discharges the DL node 38.

Figure 3:
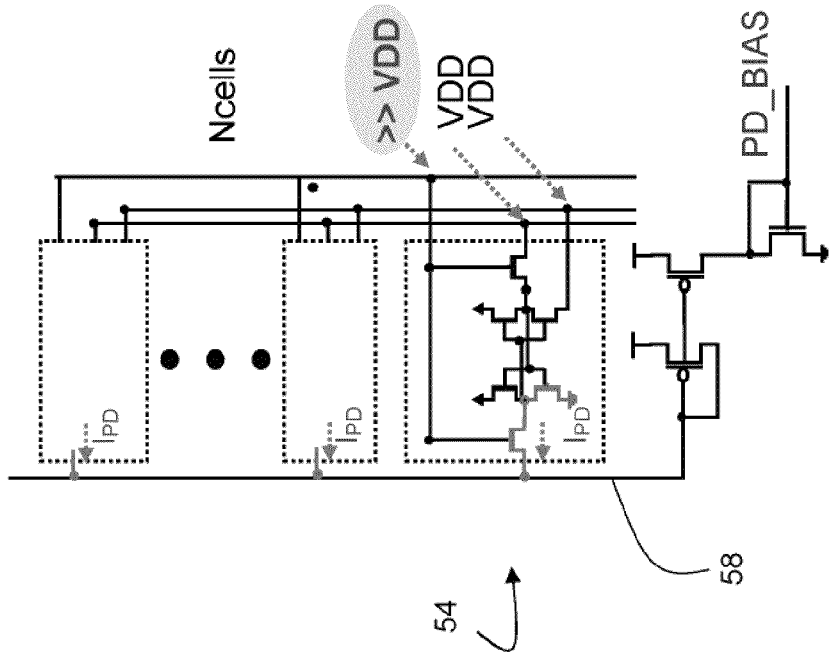
FIG. 3 depicts two additional embodiments for obtaining a reference current in accordance with the present invention.
Figure 3:
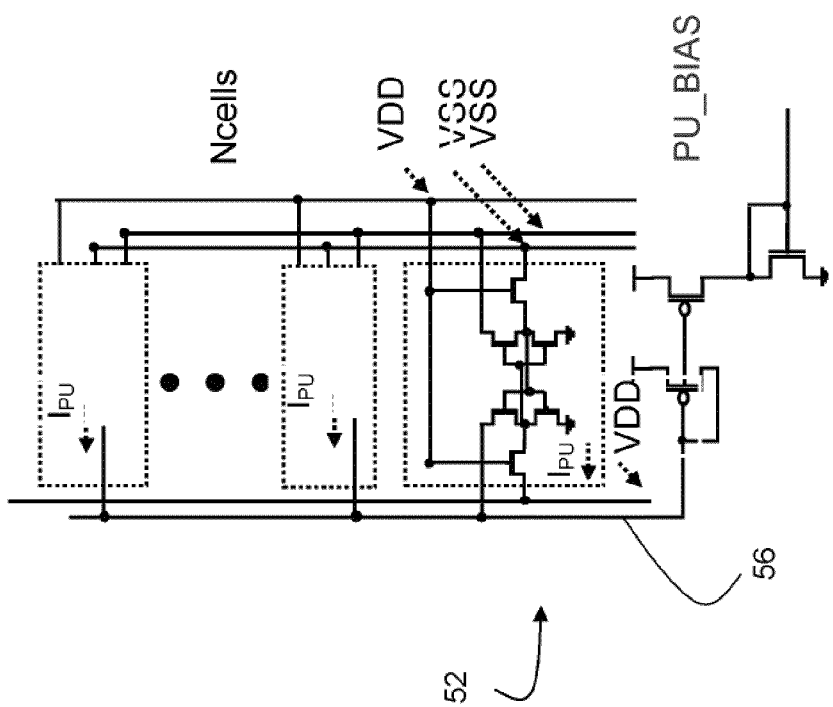

In the embodiment of FIG. 2, a pass gate (PG) configuration is utilized to obtain the reference current, i.e., a current is drawn from the pass gate transistor in each cell. More particularly, this configuration uses a current-drain through the pull down (PD) FET and the pass gate (PG) FET (with the PG FET acting as the current limiter). FIG. 3 depicts two alternative embodiments 52, 54 for obtaining reference current from a set of reference cells, and supplying the current to a bias generator. In embodiment 52, a pull-up (PU) configuration is utilized by connecting the cell signals 56 to provide a current-drain through the pull up (PU) FET and the PG FET (with the PU FET acting as the current limiter). In embodiment 54, a pull down configuration is implemented by connecting the cell signals 58 to provide a current-drain through the PD and PG FETs, in which the PG FET is gated with a much higher voltage to make the PD FET the current limiter.

Note that in each of these embodiments, a bias generator having a current mirror is utilized to generate a bias signal. However, as described herein, a bias generator/current mirror can be omitted.

Also note that the current mirror in each of the illustrative bias generator embodiments could be implemented in many different ways, e.g., cascode, etc., and could be powered down when not used. In addition, the bias generator can be used to control other SRAM-assist functions such as write assist, read assist, etc.

Figure 4:
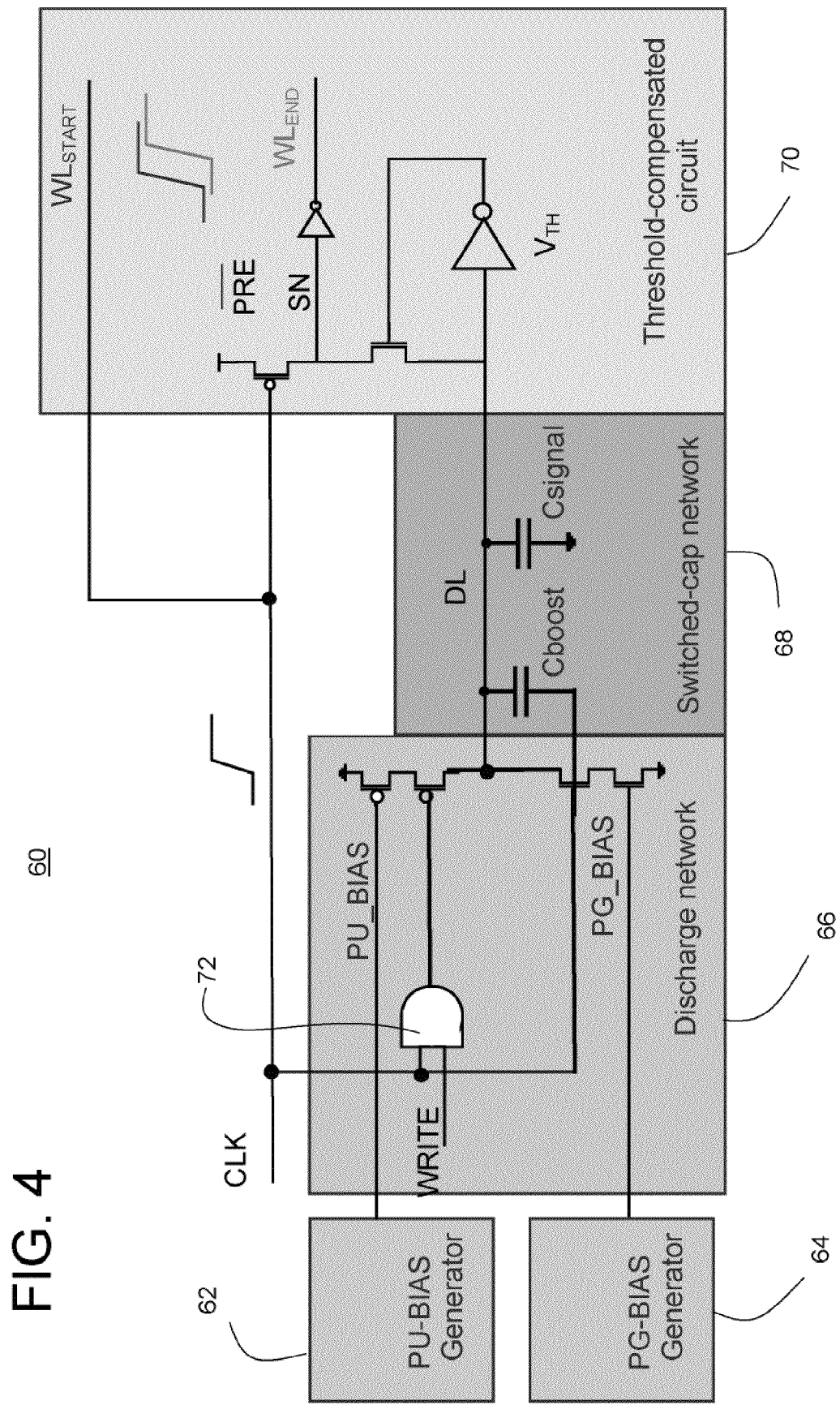
FIG. 4 depicts a delay circuit in accordance with an embodiment of the present invention.

FIG. 4 depicts an alternative embodiment of a delay circuit 60. In this embodiment, two bias generators are utilized, a PU-BIAS generator 62 and a PG-BIAS generator 64. The discharge network 66 is altered from the FIG. 2 embodiment to allow for adequate modeling of write operations in which the PU-BIAS generator 62 controls pull-up characteristics. An AND gate 72 is used to limit the pull up bias to write operations only. For read operations, the PG-BIAS generator 64 is utilized. The switched capacitance network 68 and threshold compensated circuit 70 are the same as described in FIG. 2.

Figure 5:
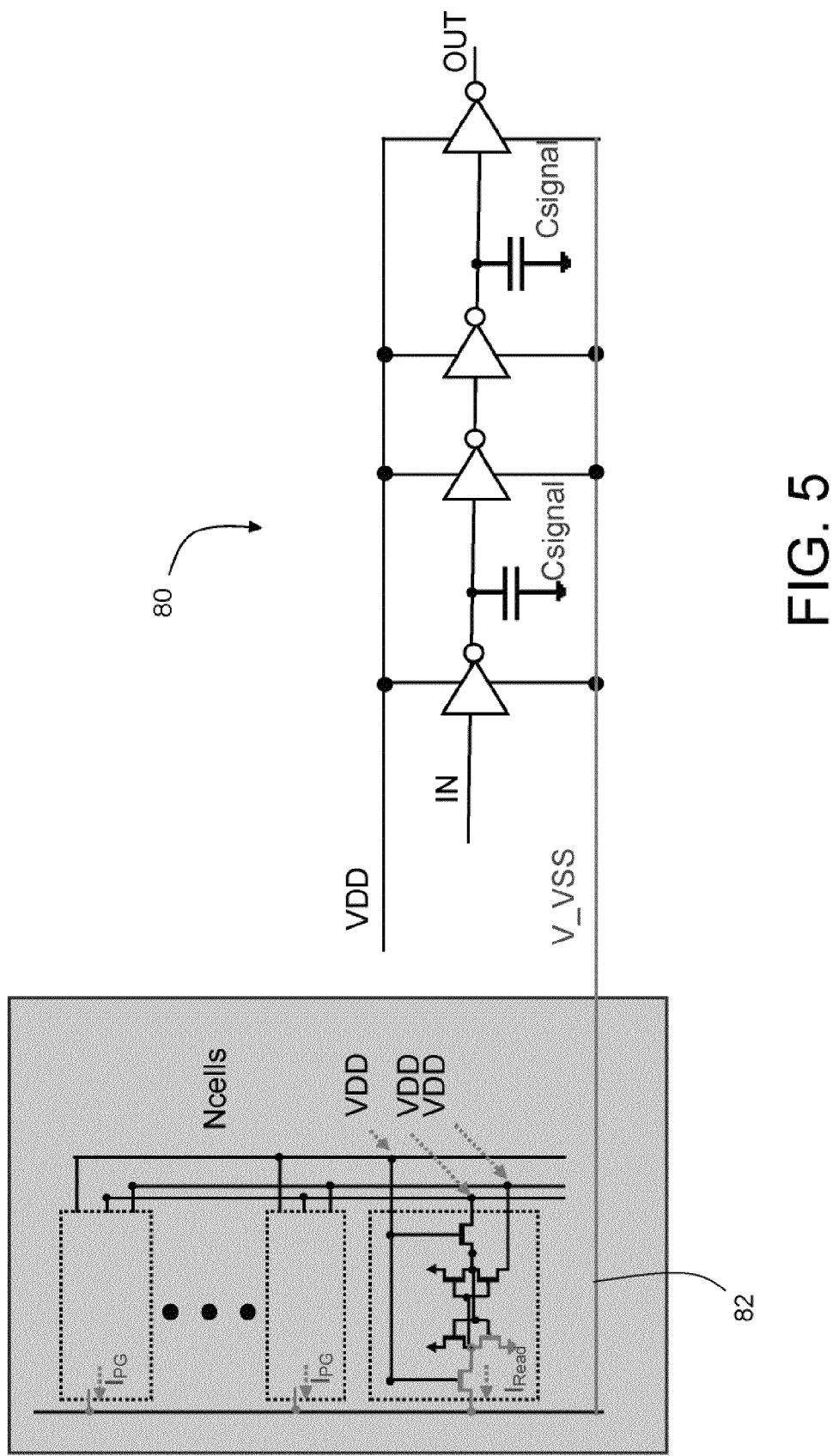
FIG. 5 depicts a delay circuit in accordance with an embodiment of the present invention.

FIG. 5 depicts a further embodiment of a delay circuit 80. In this embodiment, the reference current 82 ($I_{Read}$) is tapped from the pull down (PD) and pass gate (PG) FETs as in FIG. 2. However, current 82 is fed directly as a virtual ground (V_VSS) into the delay circuit 80. The V_VSS thus forms a supply that is entirely discharged through the PD/PG FETs of the SRAM cell, thereby controlling the discharge rate of the two Csignal capacitors and thus controlling the delay output.

Figure 6:
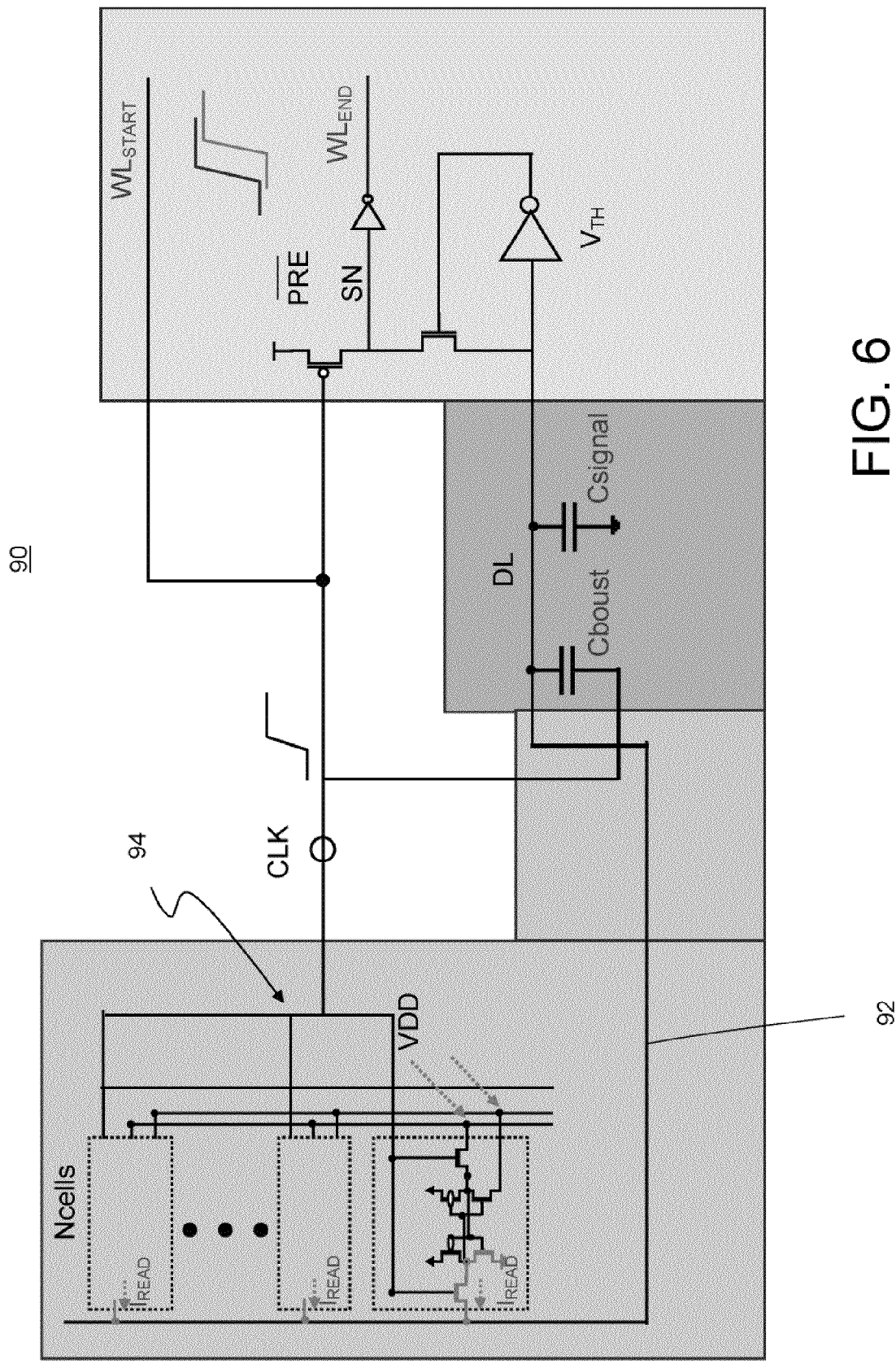
FIG. 6 depicts a delay circuit in accordance with an embodiment of the present invention.

FIG. 6 depicts still a further embodiment of a delay circuit 90. This embodiment is similar to that shown in FIG. 2, except that the bias generator/current mirror and discharge network are effectively eliminated. Instead, the reference current 92 is connected right to the DL node and a clock signal (CLK) acts as a word line 94 for the reference cells.

Figure 7:
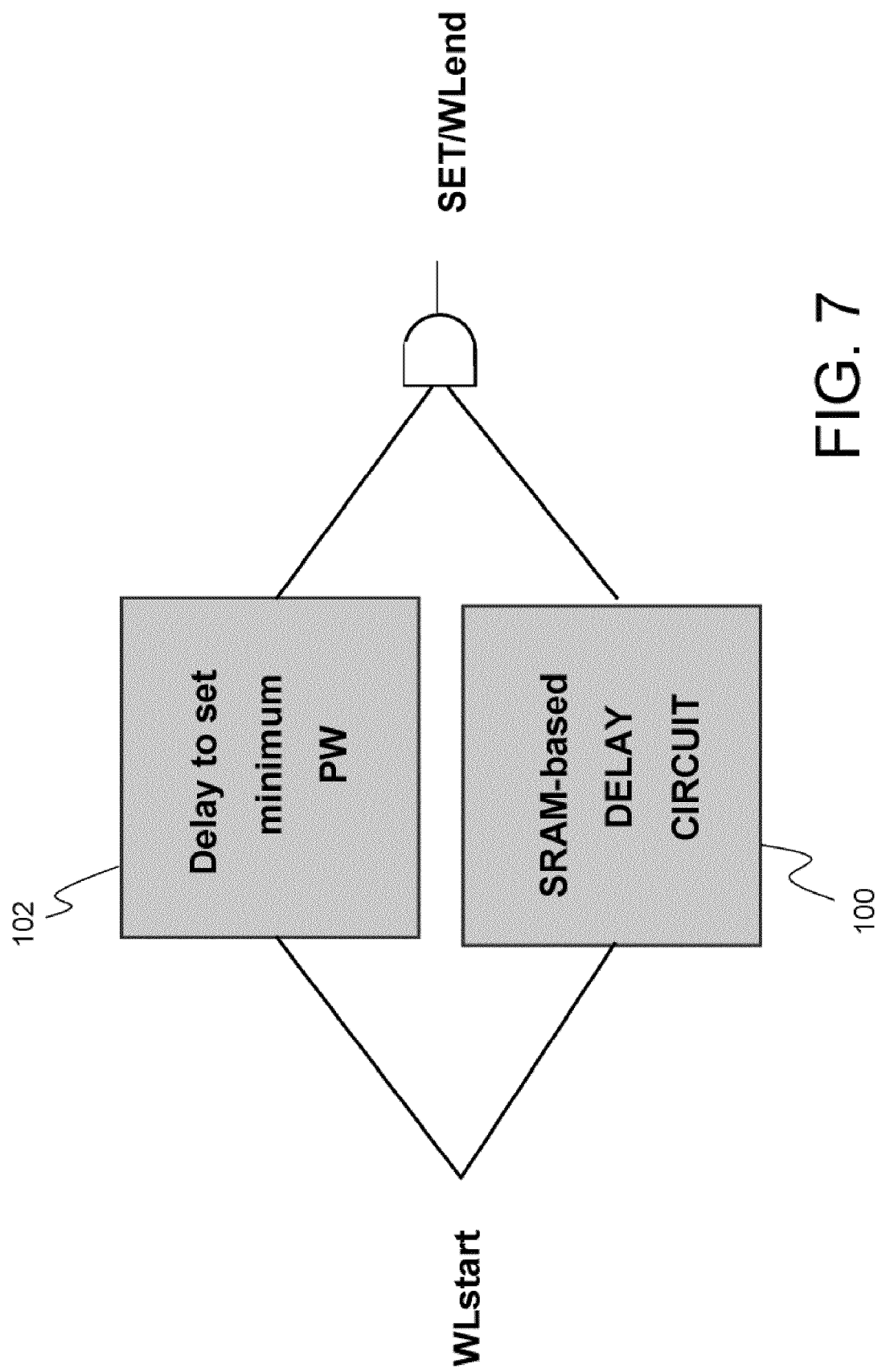
FIG. 7 depicts a limiter coupled to a delay circuit in accordance with an embodiment of the present invention.

FIG. 7 depicts a system in which an SRAM-based delay circuit 100 (as described herein) is coupled (i.e., ANDed) with a limiter 102 to set an amount of delay to no less than a minimum pulse width (PW). The limiter 102 can be made up of logic devices that for example set the minimum delay at the high voltage corner of the device.

Figure 8:
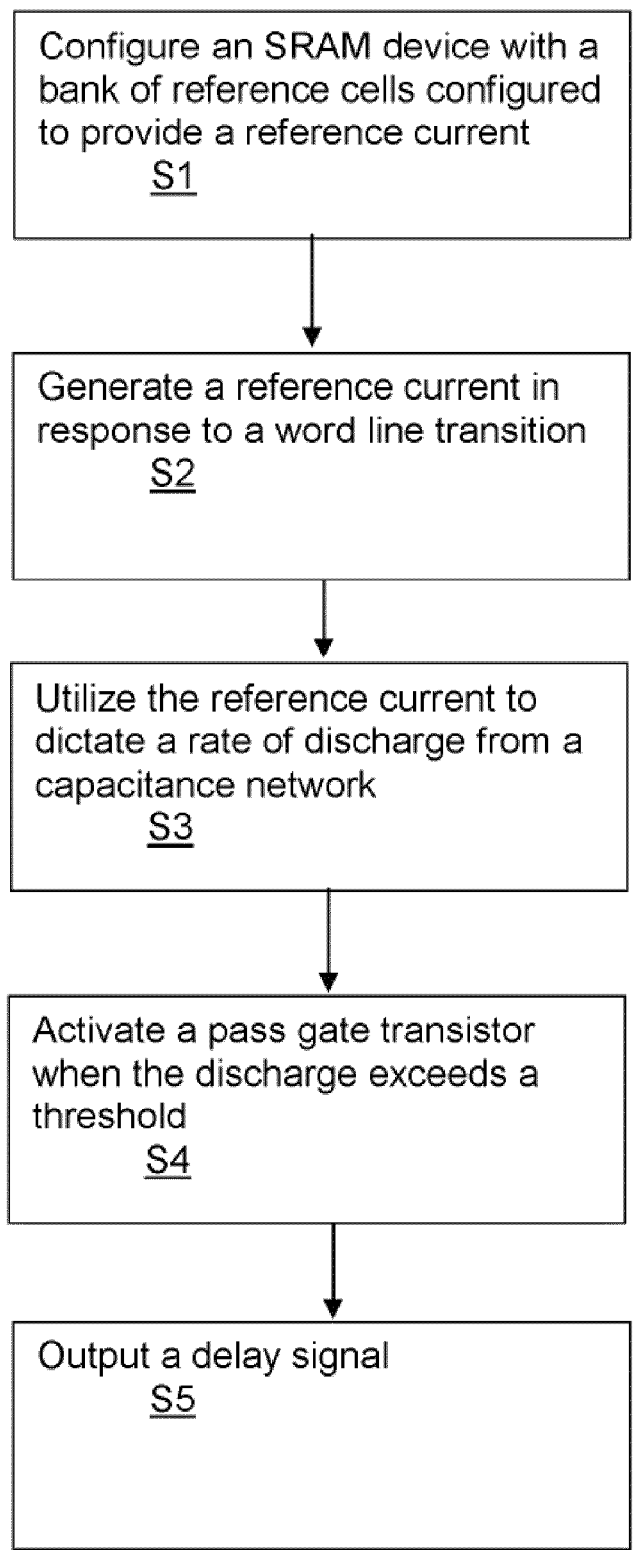
FIG. 8 depicts a flow chart showing a method of generating a delay signal in accordance with an embodiment of the present invention.

FIG. 8 depicts a flow diagram of a method for implementing an embodiment of the invention. At S1, an SRAM device is configured with a bank (i.e., plurality) of reference cells, in which the reference cells are coupled to a common reference node to provide a reference current. At S2, the reference current is generated in response to a word line transition. At S3, the reference current is utilized to dictate a rate of discharge from a capacitance network to a discharge line. At S4, a pass gate transistor is activated when the amount of discharge exceeds a threshold voltage. Finally, at S5, a delay signal is generated in response to activation of the pass gate transistor.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. An SRAM device having a delay circuit for tracking SRAM bitcell characteristics, wherein the delay circuit comprises:
    an input node for receiving an input signal;
    a reference node for capturing a reference current from a plurality of reference cells;
    a capacitance network having a discharge rate that is controlled by the reference current; and
    an output circuit that outputs a delay signal, wherein the delay signal is controlled by the discharge rate of the capacitance network, independent of any logic devices.

2. The SRAM device of claim 1, wherein the input signal comprises a clock transition.

3. The SRAM device of claim 1, wherein the reference current is captured from the plurality of reference cells using a configuration selected from the group consisting of: a pass-gate configuration; a pull-up configuration; and a pull-down configuration.

4. The SRAM device of claim 1, wherein the reference current is inputted into a bias generator having a current mirror.

5. The SRAM device of claim 4, wherein the bias generator outputs a bias to a discharge network that is coupled to the capacitance network, wherein the bias dictates a discharge rate of the capacitance network.

6. The SRAM device of claim 1, wherein the capacitance network includes a boost capacitor and a signal capacitor that generates a logic-independent voltage delta on a discharge line based on a ratio of the boost capacitor and the signal capacitor.

7. The SRAM device of claim 1, wherein the output circuit includes a pass gate transistor that is opened in response to a voltage threshold being exceeded on the discharge line.

8. The SRAM device of claim 1, wherein the reference current is utilized as a virtual ground to control the discharge of a pair of capacitors.

9. The SRAM device of claim 1, wherein the reference current is provided to a pull-up bias generator for controlling a write operation and to a pass-gate bias generator for controlling a read operation.

10. The SRAM device of claim 1, wherein the reference current is provided directly to a discharge line in a capacitance network.

11. A method of generating a delay signal in an SRAM device, comprising:
    providing an SRAM device with a plurality of reference cells coupled to a common reference node, wherein the plurality of reference cells are configured to generate a reference current at the common reference node in response to a word line transition;
    generating the reference current at the common reference node in response to the word line transition;
    using the reference current to dictate a discharge rate of a capacitance network onto a discharge line;
    activating an output circuit in response to a voltage potential on the discharge line exceeding a threshold voltage; and
    outputting a delay signal, independent of any logic devices.

12. The method of claim 11, further comprising capturing the reference current from the plurality of reference cells using a configuration selected from the group consisting of: a pass-gate configuration; a pull-up configuration; and a pull-down configuration.

13. The method of claim 11, further comprising inputting the reference current into a bias generator having a current mirror.

14. The method of claim 13, further comprising powering up or down the current mirror as required to generate the delay signal.

15. The method of claim 11, wherein the capacitance network includes a boost capacitor and a signal capacitor that generates a logic-independent voltage delta on the discharge line based on a ratio of the boost capacitor and the signal capacitor.

16. The method of claim 11, further comprising utilizing the reference current as a virtual ground to control the discharge of a pair of capacitors.

17. The method of claim 11, further comprising providing the reference current to a pull-up bias generator for controlling a write operation and to a pass-gate bias generator for controlling a read operation.

18. The method of claim 11, further comprising providing the reference current directly to the discharge line in the capacitance network.

19. A system for generating a delay signal in an SRAM device, comprising:
    a plurality of reference cells coupled to a common reference node, wherein the plurality of reference cells are configured to generate a reference current at the common reference node in response to a word line transition, wherein the reference current comprises a mean characteristic of the plurality of reference cells;
    a circuit that dictates a discharge rate of a capacitance network onto a discharge line using the reference current;
    a pass gate transistor activated in response to an amount of discharge on the discharge line exceeding a threshold voltage; and
    an output circuit activated in response to a voltage potential on the discharge line exceeding a threshold voltage, independent of any logic devices.

20. The system of claim 19, wherein the reference current is captured from the plurality of reference cells using a configuration selected from the group consisting of: a pass-gate configuration; a pull-up configuration; and a pull-down configuration.

21. The system of claim 19, further comprising a bias generator that converts the reference current to a bias using a current mirror.

22. The system of claim 19, wherein the output circuit comprises a threshold compensated circuit.

23. The system of claim 22, wherein the threshold compensated circuit references a discharge line boost from the capacitance network to a threshold reducing pressure voltage and temperature (PVT) characteristic.

24. The system of claim 19, wherein the plurality of reference cells are substantially identical in fabrication layout to a set of functional cells on the SRAM device.

25. An SRAM device having a delay circuit that utilizes a virtual ground for tracking SRAM bitcell characteristics, wherein the delay circuit comprises:
   an input node for receiving an input signal;
   a virtual ground node for capturing a reference current from a plurality of reference SRAM cells;
   a capacitance network having a pair of capacitors that provide a discharge rate controlled by the reference current; and
   an output circuit that outputs a delay signal, wherein the delay signal is controlled by the discharge rate of the capacitance network, independent of any logic devices.

* * * * *